United States Patent
Shim et al.

(10) Patent No.: US 7,554,179 B2
(45) Date of Patent: Jun. 30, 2009

(54) MULTI-LEADFRAME SEMICONDUCTOR PACKAGE AND METHOD OF MANUFACTURE

(75) Inventors: Il Kwon Shim, Singapore (SG); Seng Guan Chow, Singapore (SG); Jeffrey D. Punzalan, Singapore (SG); Pandi Chelvam Marimuthu, Singapore (SG)

(73) Assignee: Stats Chippac Ltd., Singapore (SG)

( * ) Notice: Subject to any disclaimer, the term of this patent is extended or adjusted under 35 U.S.C. 154(b) by 505 days.

(21) Appl. No.: 11/053,564

(22) Filed: Feb. 7, 2005

(65) Prior Publication Data

US 2006/0175689 A1 Aug. 10, 2006

(51) Int. Cl.
*H01L 23/495* (2006.01)
*H01L 21/50* (2006.01)
*H01L 23/28* (2006.01)
*H01L 23/48* (2006.01)
*H05K 3/34* (2006.01)

(52) U.S. Cl. .............. 257/675; 257/E23.039; 257/E23.042; 257/E23.046; 257/E23.051; 257/E23.124; 257/712; 257/713; 257/717; 257/720; 257/676; 257/684; 257/796; 438/123

(58) Field of Classification Search ........... 257/675, 257/676, E23.039, E23.042, E23.051, E23.124, 257/666, 696, 698, 712, 713, 720, 684, 796, 257/795, 690, 691, 692, 693, E23.079, E23.105, 257/E23.052, E23.092; 438/123
See application file for complete search history.

(56) References Cited

U.S. PATENT DOCUMENTS

| | | | | |
|---|---|---|---|---|
| 5,900,676 A * | 5/1999 | Kweon et al. | ............... | 257/787 |
| 6,661,083 B2 * | 12/2003 | Lee et al. | ..................... | 257/676 |
| 6,730,544 B1 * | 5/2004 | Yang | ........................... | 438/110 |
| 6,768,186 B2 | 7/2004 | Letterman, Jr. et al. | | |
| 6,849,952 B2 * | 2/2005 | Ishimura et al. | ............. | 257/777 |
| 7,061,079 B2 * | 6/2006 | Weng et al. | ................. | 257/675 |
| 7,074,653 B2 * | 7/2006 | Lange | ......................... | 438/122 |
| 7,129,568 B2 * | 10/2006 | Lee et al. | .................... | 257/666 |
| 7,169,651 B2 * | 1/2007 | Park et al. | ................... | 438/124 |
| 7,335,532 B2 * | 2/2008 | Noquil et al. | ............... | 438/108 |
| 2002/0056926 A1 * | 5/2002 | Jung et al. | ................... | 257/786 |
| 2002/0063315 A1 * | 5/2002 | Huang et al. | ................ | 257/666 |
| 2002/0144396 A1 * | 10/2002 | Glenn | ........................ | 29/841 |
| 2002/0145186 A1 * | 10/2002 | Tzu et al. | ..................... | 257/678 |
| 2003/0071333 A1 * | 4/2003 | Matsuzawa | ................. | 257/676 |
| 2003/0197290 A1 * | 10/2003 | Crowley et al. | ............. | 257/787 |
| 2004/0011699 A1 * | 1/2004 | Park | ........................... | 206/710 |
| 2004/0021220 A1 * | 2/2004 | Kubo | .......................... | 257/706 |
| 2004/0061217 A1 * | 4/2004 | Ku et al. | ...................... | 257/708 |
| 2004/0089926 A1 * | 5/2004 | Hsu et al. | .................... | 257/678 |
| 2004/0238857 A1 * | 12/2004 | Beroz et al. | ................. | 257/232 |
| 2004/0238923 A1 * | 12/2004 | Lee et al. | .................... | 257/670 |
| 2005/0001292 A1 * | 1/2005 | Hatauchi | ..................... | 257/666 |
| 2005/0037618 A1 * | 2/2005 | Lee et al. | .................... | 438/689 |
| 2005/0051877 A1 * | 3/2005 | Hsu | ........................... | 257/667 |

(Continued)

*Primary Examiner*—Alexander O Williams
(74) *Attorney, Agent, or Firm*—Mikio Ishimaru

(57) ABSTRACT

A multi-leadframe semiconductor package and method of manufacture includes a first leadframe having a die pad and a plurality of contact leads around the periphery of the die pad. A die is attached to the die pad and electrically connected to the plurality of contact leads. A heat spreader leadframe having a heat spreader and a plurality of terminal leads around the periphery of the heat spreader is provided. The die pad is attached to the heat spreader, and the plurality of contact leads is attached to the plurality of terminal leads.

20 Claims, 10 Drawing Sheets

U.S. PATENT DOCUMENTS

| | | | |
|---|---|---|---|
| 2005/0104194 A1* | 5/2005 | Weng et al. | 257/706 |
| 2005/0106777 A1* | 5/2005 | Ikenaga et al. | 438/106 |
| 2005/0121756 A1* | 6/2005 | Chow et al. | 257/676 |
| 2005/0146057 A1* | 7/2005 | Khor et al. | 257/788 |
| 2005/0167791 A1* | 8/2005 | Youn et al. | 257/666 |
| 2005/0248041 A1* | 11/2005 | Kuah et al. | 257/787 |
| 2005/0263864 A1* | 12/2005 | Islam et al. | 257/676 |
| 2006/0006510 A1* | 1/2006 | Koduri | 257/678 |
| 2006/0007661 A1* | 1/2006 | Iketaki | 361/719 |
| 2006/0033184 A1* | 2/2006 | Park et al. | 257/666 |
| 2006/0088956 A1* | 4/2006 | Hung et al. | 438/113 |
| 2006/0148127 A1* | 7/2006 | Ong et al. | 438/106 |
| 2006/0192274 A1* | 8/2006 | Lee et al. | 257/666 |
| 2006/0202313 A1* | 9/2006 | Tan et al. | 257/676 |
| 2007/0080437 A1* | 4/2007 | Marimuthu et al. | 257/676 |
| 2007/0215990 A1* | 9/2007 | San Antonio et al. | 257/666 |

* cited by examiner

US 7,554,179 B2

MULTI-LEADFRAME SEMICONDUCTOR PACKAGE AND METHOD OF MANUFACTURE

TECHNICAL FIELD

The present invention relates generally to semiconductor packages, and more particularly to a method and apparatus for manufacturing a semiconductor package for high heat dissipation applications.

BACKGROUND ART

Electronic system manufacturers continue to demand integrated circuits with higher performance and reliability along with a reduced physical size and manufacturing cost. One package that has been developed is the QFN (quad flat non-leaded) package. QFN packages use a leadframe as a package carrier to provide semiconductor packages of reduced size.

The leadframe includes a die pad and a number of leads around the periphery of the die pad. A die is attached to the die pad. The die is electrically connected to the leads using a wire bonding process. The resulting structure is encapsulated with a molding compound while allowing the lower surfaces of the die pad and the leads to be exposed through the encapsulant.

Semiconductors used in high power circuits often require thicker leadframe metal to support high current levels and adequately dissipate heat generated by the circuit. The use of QFN packages in applications requiring high heat and power dissipation typically use leadframes that are substantially thicker than the leadframes that are used in standard QFN packages. The use of thicker leadframes increases the unit cost of the package and introduces certain processing limitations.

For example, existing tooling used to manufacture standard QFN packages typically cannot be used for power QFN packages. Additionally, saw singulation often is the singulation process used to separate power QFN packages because punch singulation adversely affects the integrity of the packages and causes yield and quality problems in manufacturing.

Hence, there is a need for a QFN integrated circuit and package that has a high current and thermal dissipation capability while maintaining high reliability and a low manufacturing cost.

Solutions to these problems have been long sought but prior developments have not taught or suggested any solutions and, thus, solutions to these problems have long eluded those skilled in the art.

DISCLOSURE OF THE INVENTION

The present invention provides a multi-leadframe semiconductor package and method of manufacture. A first leadframe having a die pad and a plurality of contact leads around the periphery of the die pad is provided. A die attached to the die pad and electrically connected to the plurality of contact leads is provided. A heat spreader leadframe having a heat spreader and a plurality of terminal leads around the periphery of the heat spreader is provided. The die pad is attached to the heat spreader, and the plurality of contact leads is attached to the plurality of terminal leads.

The present invention provides a low cost semiconductor package that can be used in applications requiring high current and thermal dissipation.

Certain embodiments of the invention have other advantages in addition to or in place of those mentioned above. The advantages will become apparent to those skilled in the art from a reading of the following detailed description when taken with reference to the accompanying drawings.

BEST MODE FOR CARRYING OUT THE INVENTION

Figure 1:
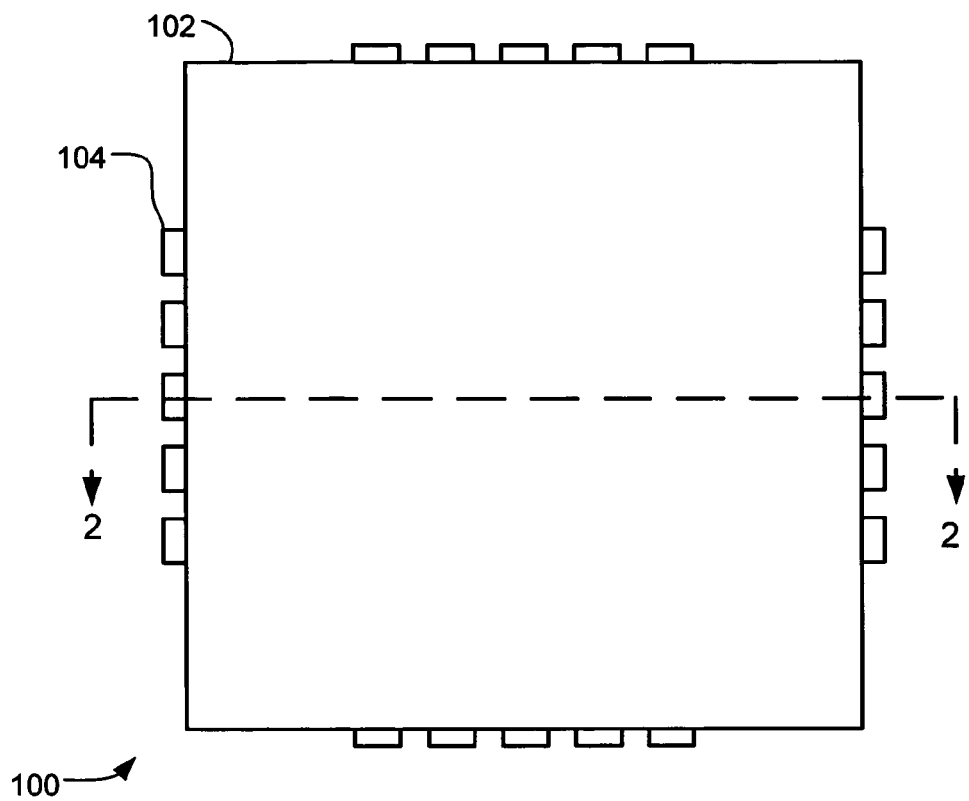
FIG. 1 is a top plan view of a multi-leadframe semiconductor package manufactured in accordance with an embodiment of the present invention.

In the following description, numerous specific details are given to provide a thorough understanding of the invention. However, it will be apparent that the invention may be practiced without these specific details. In order to avoid obscuring the present invention, some well-known system configurations and process steps are not disclosed in detail. Likewise, the drawings showing embodiments of the device are semi-diagrammatic and not to scale and, particularly, some of the dimensions are for the clarity of presentation and are shown greatly exaggerated in the FIGs. Generally, the device can be operated in any orientation. In addition, where multiple embodiments are disclosed and described having some features in common, for clarity and ease of illustration and description thereof like features one to another will ordinarily be described with like reference numerals.

The term "horizontal" as used herein is defined as a plane parallel to the conventional plane or surface of the device, regardless of its orientation. The term "vertical" refers to a direction perpendicular to the horizontal as just defined. Terms, such as "on", "above", "below", "bottom", "top", "side" (as in "sidewall"), "higher", "lower", "over", and "under", are defined with respect to the horizontal plane.

Referring now to FIG. 1, therein is shown a top plan view of a multi-leadframe semiconductor package 100 manufactured in accordance with an embodiment of the present invention. The multi-leadframe semiconductor package 100 includes an encapsulant 102 and a number of terminal pads 104. The encapsulant 102 covers and seals a die (not shown) that is connected electrically to the terminal pads 104.

Figure 2:
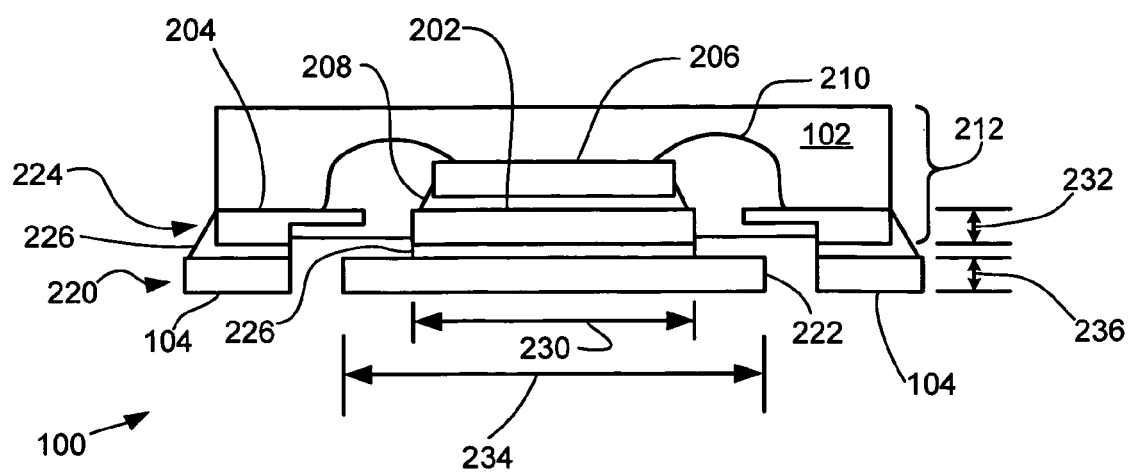
FIG. 2 is a cross-sectional view of the structure of FIG. 1 taken along line 2-2.

Referring now to FIG. 2 therein is shown a cross-sectional view of the structure of FIG. 1 taken along line 2-2. The multi-leadframe semiconductor package 100 has a first leadframe 224. The first leadframe 224 includes a die pad 202 that is centrally located on the first leadframe 224. The die pad 202 has the contact pads 204 positioned around its periphery. The first leadframe 224 typically has a finish of at least one of tin-lead solder, lead-free solder, nickel-palladium-gold alloy, or a combination thereof.

A die 206 is attached to the die pad 202 using an adhesive layer 208. The adhesive layer 208 is thermally and electrically conductive. The die 206 is wire bonded to the contact pads 204 using a number of bond wires 210. The bond wires 210 electrically connect the die 206 to the contact pads 204.

The encapsulant 102 covers the die 206, the upper portion of the contact pads 204, and the bond wires 210 to protect the die 206 from the environment and provide a packaged integrated circuit 212. A lower surface of the die pad 202 and a lower surface of the contact pads 204 are exposed through the encapsulant 102, and may extend outwardly from the outer edge of the encapsulant 102.

The packaged integrated circuit 212 at this stage of manufacture can be tested in accordance with standard manufacturing testing procedures. The packaged integrated circuit 212 is at least one of a packaged leaded integrated circuit, a packaged non-leaded integrated circuit, or a combination thereof. Additionally, the packaged integrated circuit 212 can be maintained in finished goods inventory for use in applications that do not require high heat dissipation. When an application requiring high heat dissipation arises, the packaged integrated circuit 212 is ready for further manufacturing as discussed below. Accordingly, the packaged integrated circuit 212 is suitable for a wider variety of applications, and the multi-leadframe semiconductor 100 can be manufactured using the packaged integrated circuit 212 resulting in inventory of semiconductors for only high heat dissipation applications being reduced.

A heat spreader leadframe 220 includes a heat spreader 222 that is centrally located on the heat spreader leadframe 220. The heat spreader leadframe 220 also includes the terminal pads 104 around the periphery of the heat spreader 222. An upper surface of the heat spreader leadframe 224 is attached to the exposed lower surface of the first leadframe 224 using an adhesive layer 226 that is both electrically and thermally conductive. Typically, the adhesive layer is at least one of a eutectic solder, a high lead solder, a lead-free solder, a preform solder, an electrically and thermally conductive paste adhesive, an electrically and thermally conductive film adhesive, and combinations thereof.

The heat spreader leadframe 220 is aligned so the die pad 202 of the first leadframe 224 is attached to the heat spreader 222 of the heat spreader leadframe 220. Similarly, the contact pads 204 are aligned vertically with the terminal pads 104 and attached using the adhesive layer 226.

In one embodiment, the first leadframe 224 has a first horizontal dimension 230 and a first thickness 232. The first thickness typically is about 0.125 to 0.25 mm. The heat spreader leadframe 220 has a second horizontal dimension 234 and a second thickness 236. Typically, the second horizontal dimension 234 is at least equal to the first horizontal dimension 230. Similarly, the second thickness 236 is at least equal to the first thickness 232.

Figure 3:
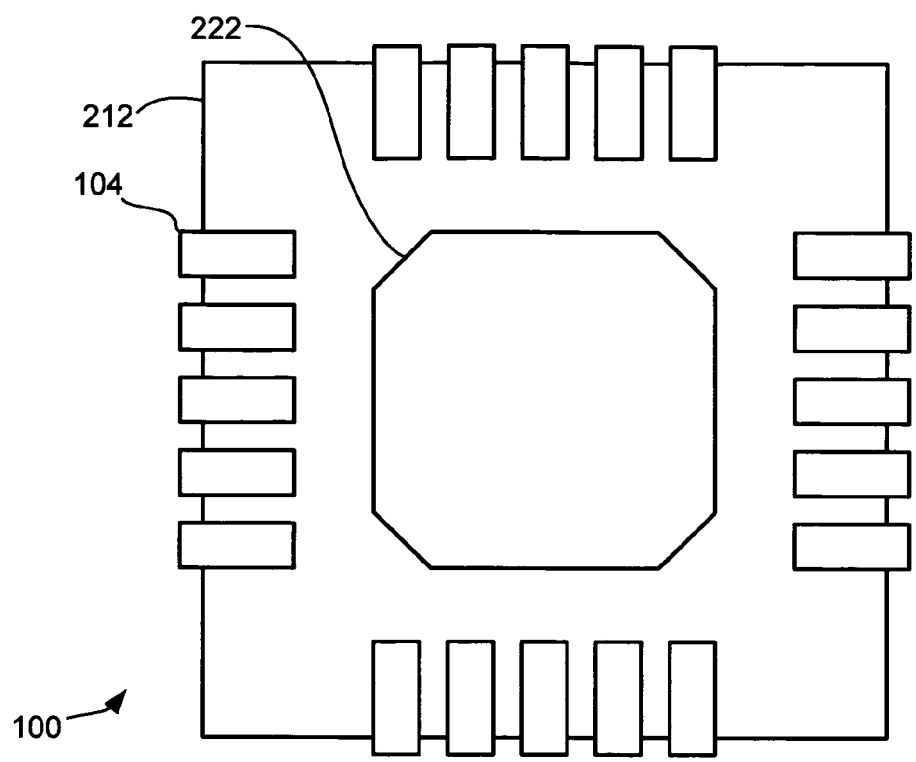
FIG. 3 is a bottom plan view of the structure of FIGS. 1 and 2.

Referring now to FIG. 3, therein is shown a bottom plan view of the structure of FIGS. 1 and 2. The multi-leadframe semiconductor package 100 has the heat spreader 222 centrally located. The heat spreader 222 has the terminal pads 104 around the periphery of the heat spreader 222. The bottom surface of the heat spreader 222 and the terminal pads 104 are exposed.

Figure 4:
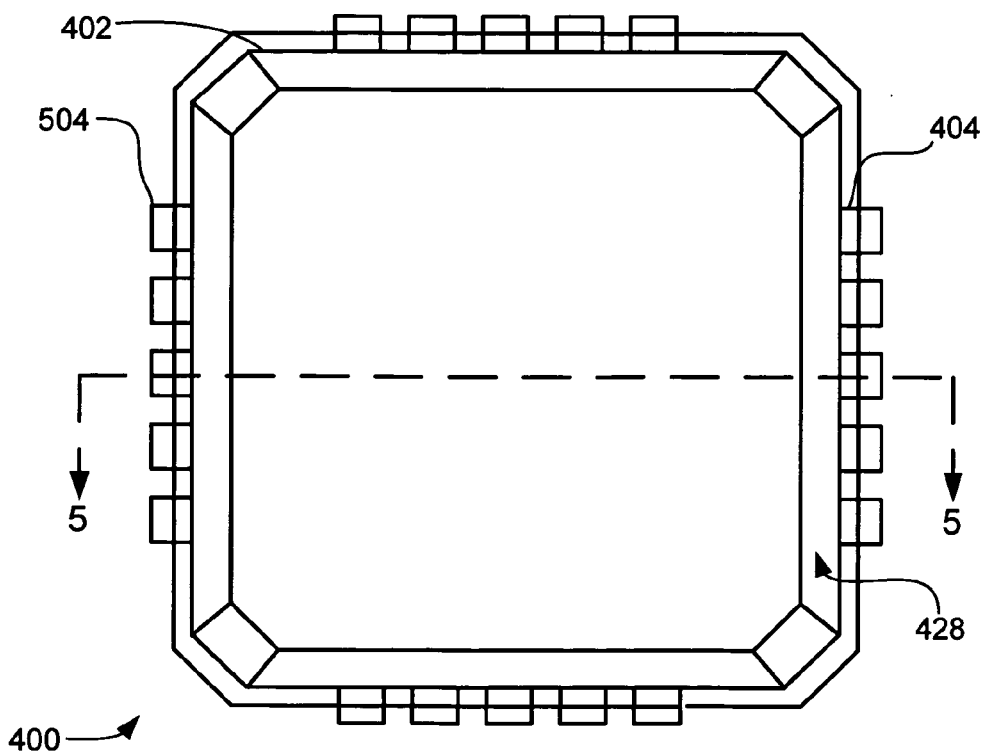
FIG. 4 is a top plan view of multi-leadframe semiconductor package manufactured in accordance with another embodiment of the present invention.
Figure 5:
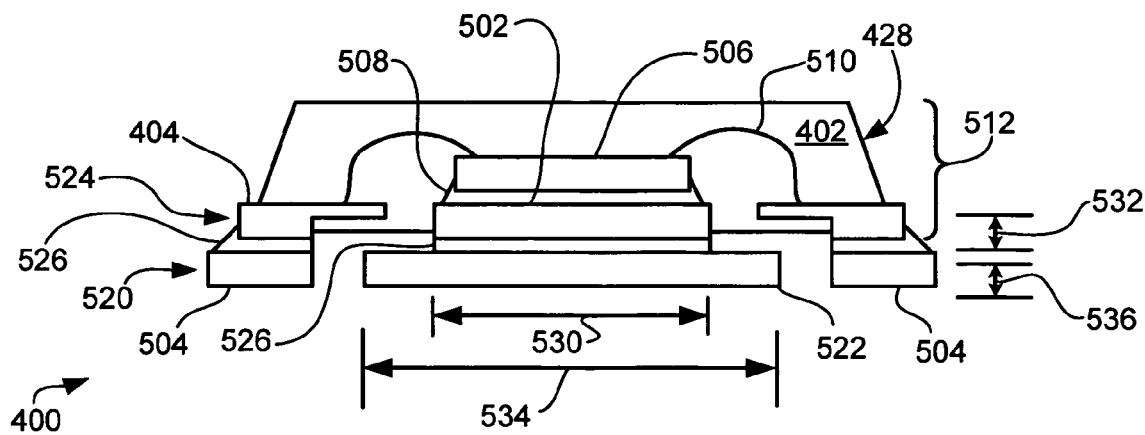
FIG. 5 is a cross-sectional view of the structure of FIG. 4 taken along line 5-5.

Referring now to FIG. 4, therein is shown a top plan view of a multi-leadframe semiconductor package 400 manufactured in accordance with another embodiment of the present invention. The multi-leadframe semiconductor package 400 includes an encapsulant 402 and a number of terminal pads 404. The encapsulant 402 covers and seals a die (not shown) that is connected electrically to a number of contact pads 404 that partially extend laterally beyond the outer edge of the encapsulant 402. The contact pads 404 forms part of a first leadframe as shown in FIG. 5. The contact pads 404 are attached to a number of terminal pads 504 using an adhesive layer 526. The terminal pads 504 form part of a heat spreader leadframe, as shown in FIG. 2.

The encapsulant 402 has a tapered surface 428 around its periphery that facilitates removal of the integrated circuit 400 from the mold used to form the encapsulant 402. Additionally, electrical connections can be made to the exposed portions of the contact pads 404, if necessary for a particular design.

Referring now to FIG. 5 therein is shown a cross-sectional view of the structure of FIG. 4 taken along line 5—5. The multi-leadframe semiconductor package 400 has a first leadframe 524. The first leadframe 524 includes a die pad 502 that is centrally located on the first leadframe 524. The die pad 502 has the contact pads 404 positioned around its periphery. The first leadframe 524 typically has a finish of at least one of tin-lead solder, lead-free solder, nickel-palladium-gold alloy, or a combination thereof.

A die 506 is attached to the die pad 502 using an adhesive layer 508. The adhesive layer 508 is thermally and electrically conductive. The die 506 is wire bonded to the contact pads 404 using a number of bond wires 510. The bond wires 510 electrically connect the die 506 to the contact pads 404.

The encapsulant 402 covers the die 506, the upper portion of the contact pads 404, and the bond wires 510 to protect the die 508 from the environment and provide an integrated circuit. A lower surface of the die pad 502 and a lower surface of the contact pads 404 are exposed through the encapsulant 402, and may extend outwardly from the outer edge of the encapsulant 402.

The packaged integrated circuit 512 at this stage of manufacture can be tested in accordance with standard manufacturing testing procedures. The packaged integrated circuit 512 is at least one of a packaged leaded integrated circuit, a packaged non-leaded integrated circuit, or a combination thereof. Additionally, the packaged integrated circuit 512 can be maintained in finished goods inventory for use in applications that do not require high heat dissipation. When an application requiring high heat dissipation arises, the packaged integrated circuit 512 is ready for further manufacturing as discussed below. Accordingly, the packaged integrated circuit 512 is suitable for a wider variety of applications, and the multi-leadframe semiconductor 400 can be manufactured using the packaged integrated circuit 512 resulting in inventory of semiconductors for only high heat dissipation applications being reduced.

A heat spreader leadframe 520 includes a heat spreader 522 that is centrally located on the heat spreader leadframe 520. The heat spreader leadframe 520 also includes the terminal pads 504 around the periphery of the heat spreader 522. The heat spreader 522 of the heat spreader leadframe 520 typically has a horizontal dimension that is greater than or equal to the horizontal dimension of the die pad 502 of the first leadframe 524. An upper surface of the heat spreader leadframe 520 is attached to the exposed surface of the first leadframe 524 using the adhesive layer 526 that is both electrically and thermally conductive. Typically, the adhesive layer is at least one of a eutectic solder, a high lead solder, a lead-free solder, a pre-form solder, an electrically and thermally conductive paste adhesive, an electrically and thermally conductive film adhesive, and combinations thereof.

The heat spreader leadframe 520 is aligned so the die pad 502 of the first leadframe 524 is attached to the heat spreader 522 of the heat spreader leadframe 520. Similarly, the terminal pads 504 are aligned vertically with the contact pads 404 and attached using the adhesive layer 526.

The first leadframe 524 has a first horizontal dimension 530 and a first thickness 532. The first thickness typically is about 0.125 to 0.25 mm. The heat spreader leadframe 520 has a second horizontal dimension 534 and a second thickness 536. Typically, the second horizontal dimension 534 is at least equal to the first horizontal dimension 530. Similarly, the second thickness 536 is at least equal to the first thickness 532.

Figure 6:
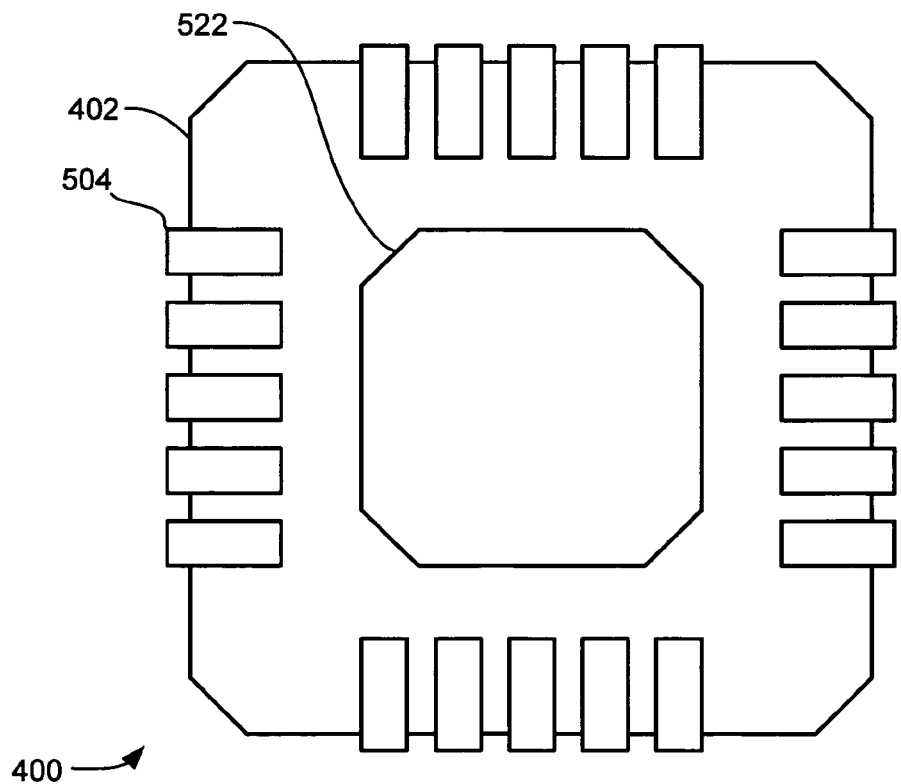
FIG. 6 is a bottom plan view of the structure of FIGS. 4 and 5.

Referring now to FIG. 6, therein is shown a bottom plan view of the structure of FIGS. 4 and 5. The multi-leadframe semiconductor circuit package 400 has the heat spreader 522 centrally located. The heat spreader 522 has the terminal pads 504 around the periphery of the heat spreader 522. The bottom surface of the heat spreader 522 and the terminal pads 504 are exposed through the bottom of the encapsulant 402.

Figure 7:
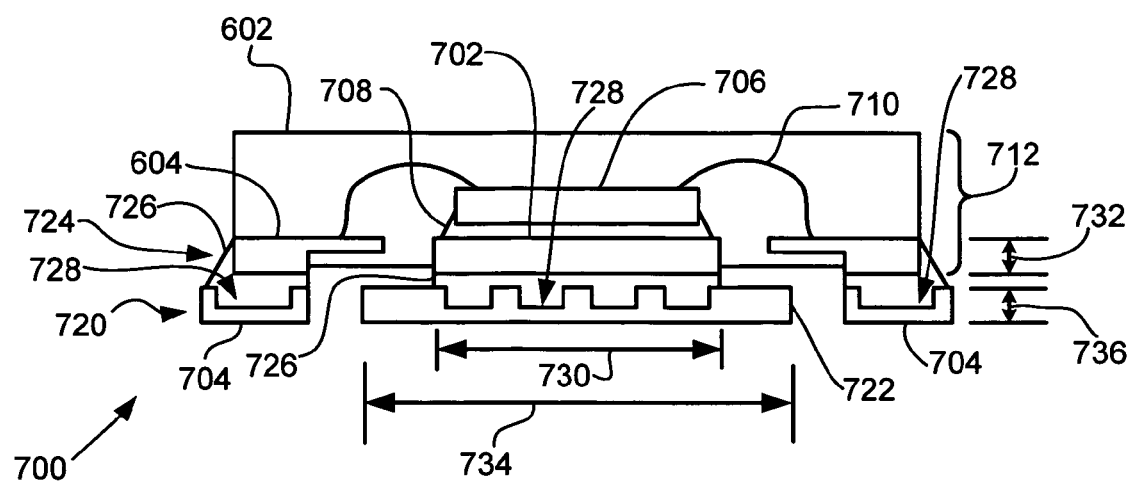
FIG. 7 is a cross-sectional view of a semiconductor package manufactured in accordance with a further embodiment of the present invention.

Referring now to FIG. 7, therein is shown a cross-sectional view of a multi-leadframe semiconductor package 700 manufactured in accordance with a further embodiment of the present invention. The semiconductor package 700 has a first leadframe 724. The first leadframe 724 includes a die pad 702 that is centrally located on the first leadframe 724. The first leadframe 724 typically has a finish of at least one of tin-lead solder, lead-free solder, nickel-palladium-gold alloy, or a combination thereof.

The die pad 702 has a number of contact pads 604 positioned around its periphery. A die 706 is attached to the die pad 702 using an adhesive layer 708. The adhesive layer 708 is thermally and electrically conductive. The die 706 is wire bonded to the contact pads 604 using a number of bond wires 710. The bond wires 710 electrically connect the die 706 to the contact pads 604.

An encapsulant 602 covers the die 706, the upper portion of the contact pads 604, and the bond wires 710 to protect the die 706 from the environment and provide an integrated circuit. A lower surface of the die pad 702 and a lower surface of the contact pads 604 are exposed through the encapsulant, and may extend outwardly from the outer edge of the encapsulant.

The packaged integrated circuit 712 at this stage of manufacture can be tested in accordance with standard manufacturing testing procedures. The packaged integrated circuit 712 is at least one of a packaged leaded integrated circuit, a packaged non-leaded integrated circuit, or a combination thereof. Additionally, the packaged integrated circuit 712 can be maintained in finished goods inventory for use in applications that do not require high heat dissipation. When an application requiring high heat dissipation arises, the packaged integrated circuit 712 is ready for further manufacturing as discussed below. Accordingly, the packaged integrated circuit 712 is suitable for a wider variety of applications, and the multi-leadframe semiconductor 400 can be manufactured using the packaged integrated circuit 712 resulting in inventory of semiconductors for only high heat dissipation applications being reduced.

A heat spreader leadframe 720 includes a heat spreader 722 that is centrally located on the heat spreader leadframe 720. The heat spreader leadframe 720 also includes the terminal pads 704 positioned around the periphery of the heat spreader 722. The heat spreader 722 of the heat spreader leadframe 720 typically has a horizontal dimension that is greater than or equal to the horizontal dimension of the die pad 702 of the first leadframe 724. An upper surface of the heat spreader leadframe 720 is attached to the exposed lower surface of the first leadframe 724 using a suitable adhesive layer 726 that is both electrically and thermally conductive. Typically, the adhesive layer is at least one of a eutectic solder, a high lead solder, a lead-free solder, a pre-form solder, an electrically and thermally conductive paste adhesive, an electrically and thermally conductive film adhesive, or a combination thereof.

The heat spreader leadframe 720 is aligned so the die pad 702 of the first leadframe 724 is attached to the heat spreader 722 of the heat spreader leadframe 720. Similarly, the contact pads 604 are aligned vertically with the terminal pads 704 and attached using the adhesive layer 726.

The heat spreader 722 and the terminal pads 704 have a number of indentations 728 formed in their upper surfaces to provide an interlocking effect between the die pad 702 and the heat spreader 722 and also between the number of contact pads 604 and the number of terminal pads 704 once the adhesive layer 726 has been cured. The indentations 728 also increase the effective thickness of the adhesive layer 726 between the die pad 702 and the heat spreader 722 thereby reducing solder joint fatigue under thermal cycling conditions of the semiconductor package 700 during operation. Although the indentations 728 are shown formed in the heat spreader 722 and the terminal pads 704, it will be apparent upon a reading of this disclosure that the indentations also may be formed in the lower surface of the die pad 702 and the contact pads 604. The indentations may be provided in any number of different types of semiconductor packages manufactured in accordance with various embodiments of the present invention.

In one embodiment, the first leadframe 724 has a first horizontal dimension 730 and a first thickness 732. The first thickness typically is about 0.125 to 0.25 mm. The heat spreader leadframe 720 has a second horizontal dimension 734 and a second thickness 736. Typically, the second horizontal dimension 734 is at least equal to the first horizontal dimension 730. Similarly, the second thickness 736 is at least equal to the first thickness 732.

Figure 8:
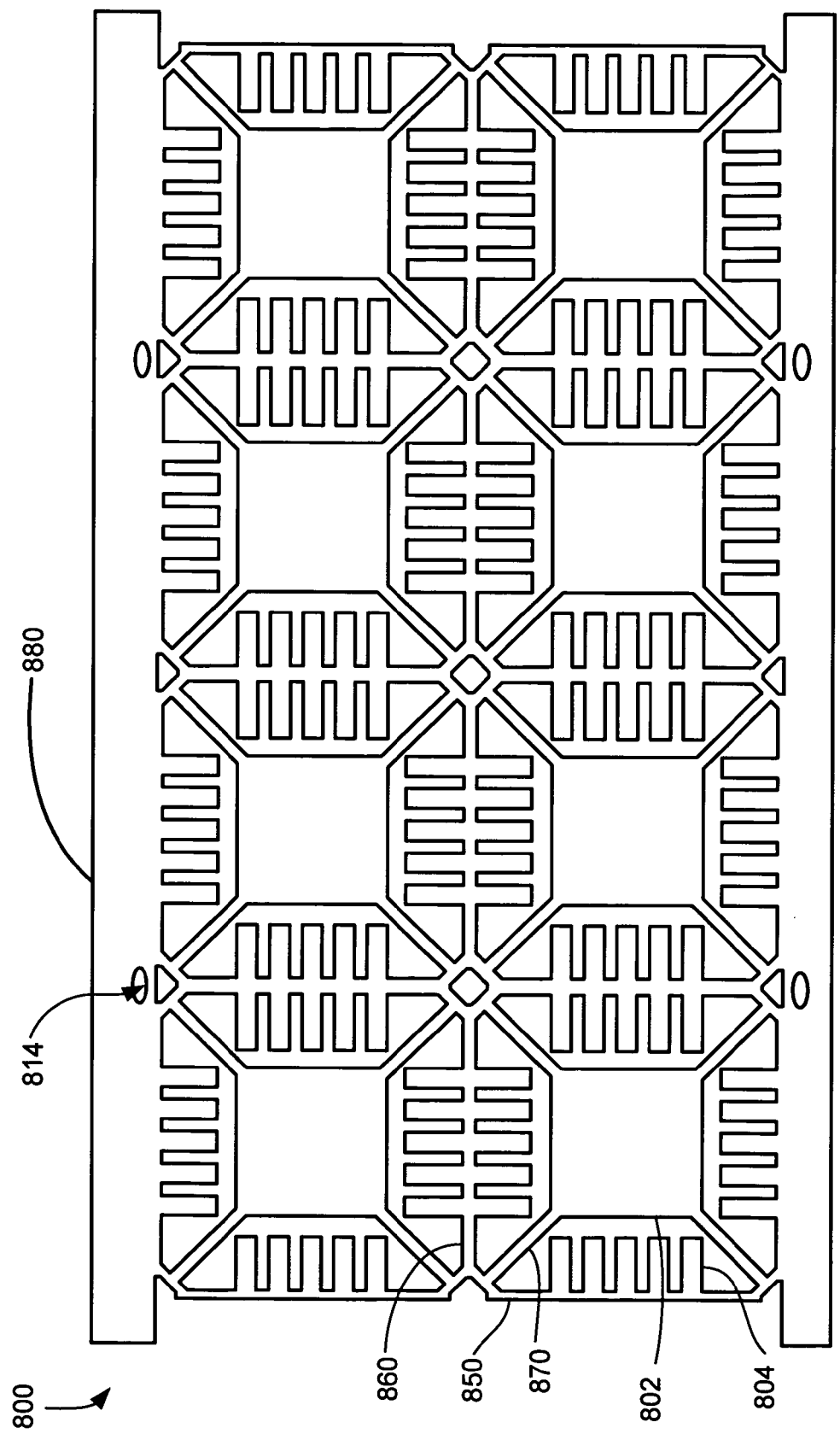
FIG. 8 is a plan view of a portion of a strip of heat spreader leadframes used in accordance with an additional embodiment of the present invention at an intermediate stage of manufacture.

Referring now to FIG. 8, therein is shown a plan view of a portion of a strip of heat spreader leadframes 800 used in accordance with an additional embodiment of the present invention at an intermediate stage of manufacture. The strip of heat spreader leadframes 800 includes a number of heat spreaders 802 connected to the strip of heat spreader leadframes 800 by a matrix of corner tie-bars 870. A number of terminal pads 804 is connected to the matrix by a number of vertical tie-bars 850 and a number of horizontal tie-bars 860. The matrix of tie-bars is connected to and between a pair of side rails 880 to form the strip of heat spreader leadframes 800. The pair of side rails 880 has a number of spaces 814 formed to provide alignment guides.

Figure 9:
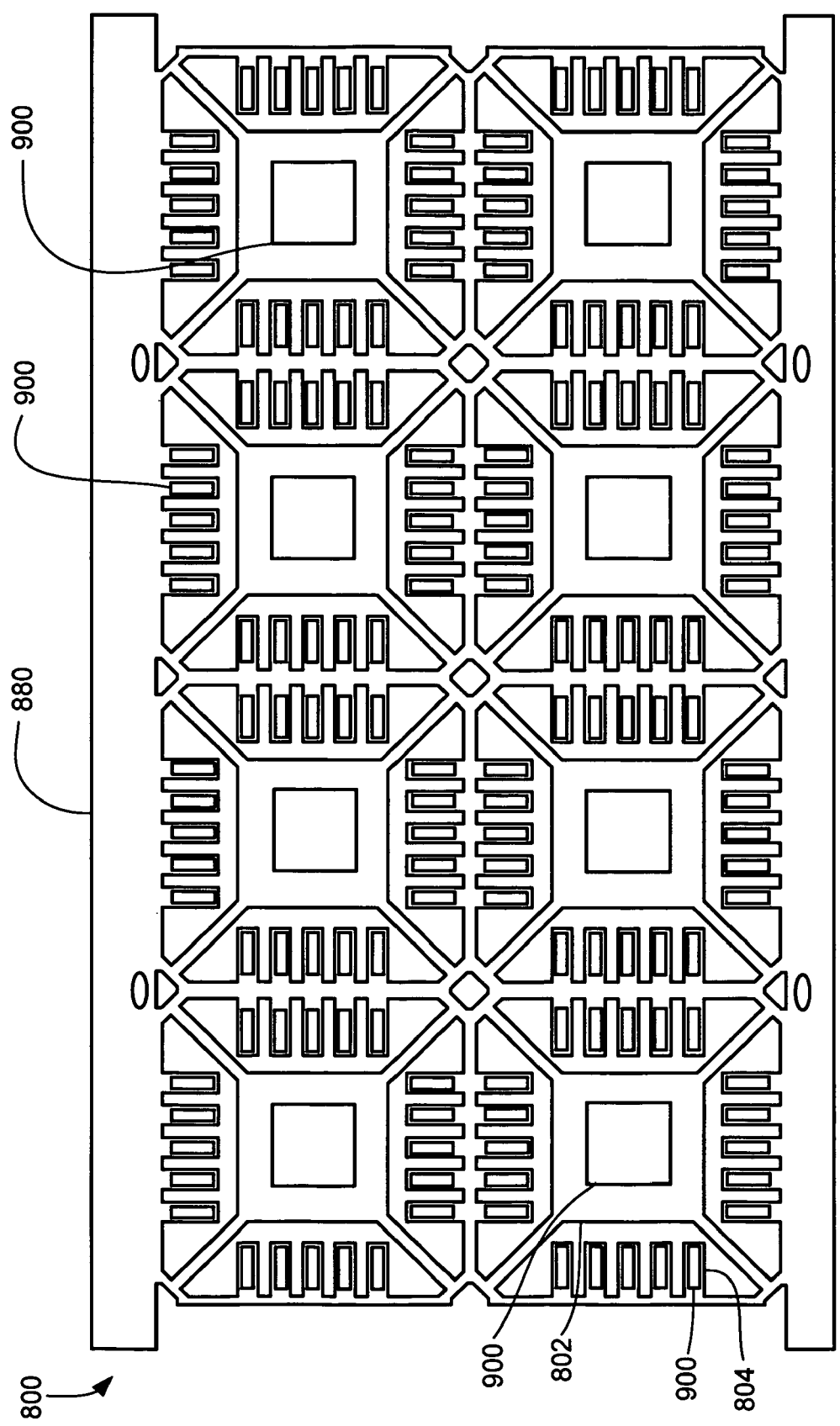
FIG. 9 is the structure of FIG. 8 after selective application of an adhesive layer.

Referring now to FIG. 9, therein is shown the structure of FIG. 8 after selective application of an adhesive layer 900. The adhesive layer 900, such as solder paste, is applied to the heat spreaders 802 and the terminal pads 804 using equipment readily available in the semiconductor industry.

Figure 10:
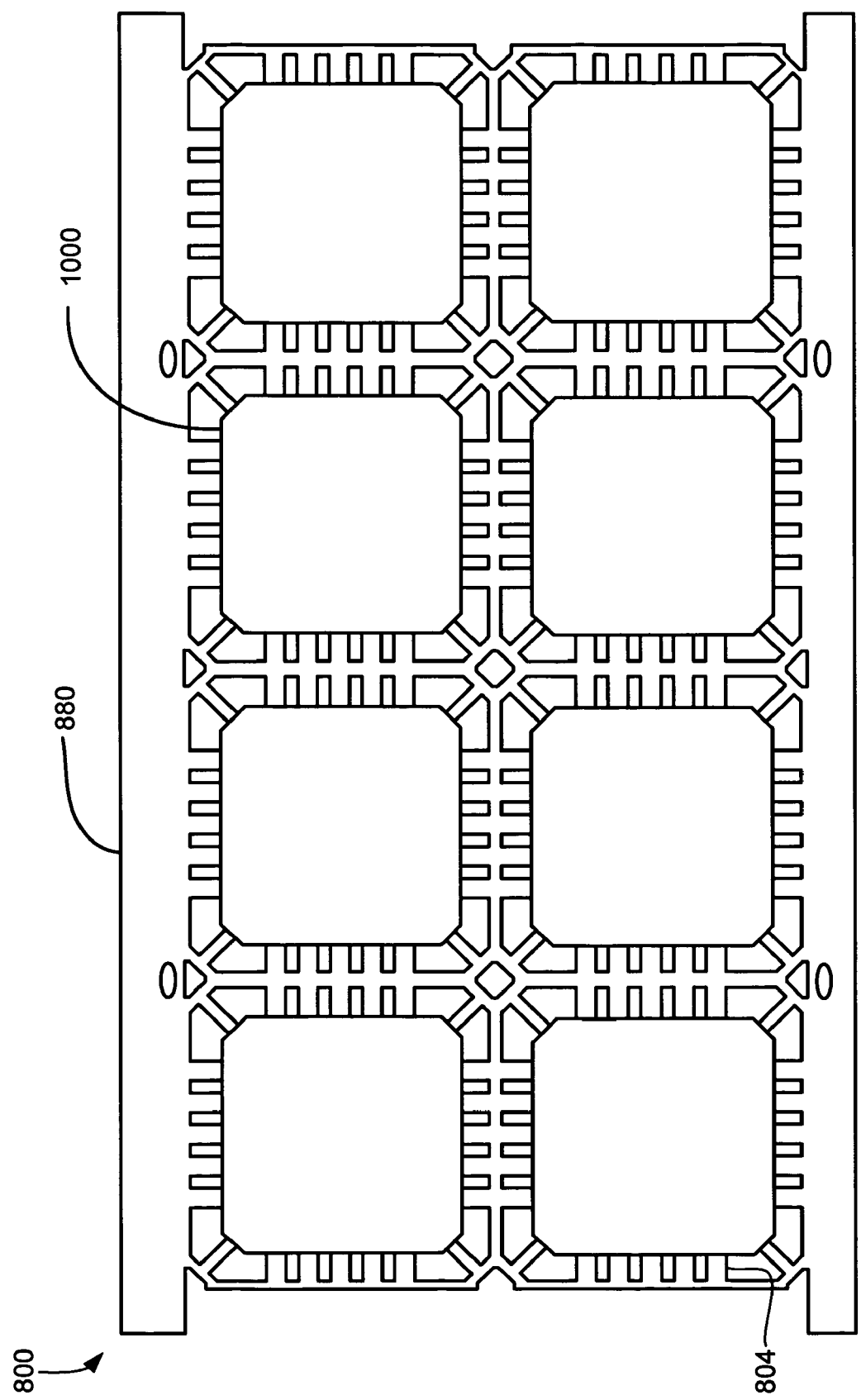
FIG. 10 is the structure of FIG. 9 after placement of QFN packages on the strip of heat spreader leadframes.

Referring now to FIG. 10, therein is shown the structure of FIG. 9 after placement of QFN packages 1000 on the strip of heat spreader leadframes 800. The QFN packages 1000 are positioned over the heat spreaders 802 shown in FIGS. 9 and 10 and the terminal pads 804. The QFN packages 1000 are attached to the heat spreaders 802 shown in FIGS. 9 and 10 and the terminal pads 804 using the adhesive layer 900 shown in FIG. 9.

Figure 11:
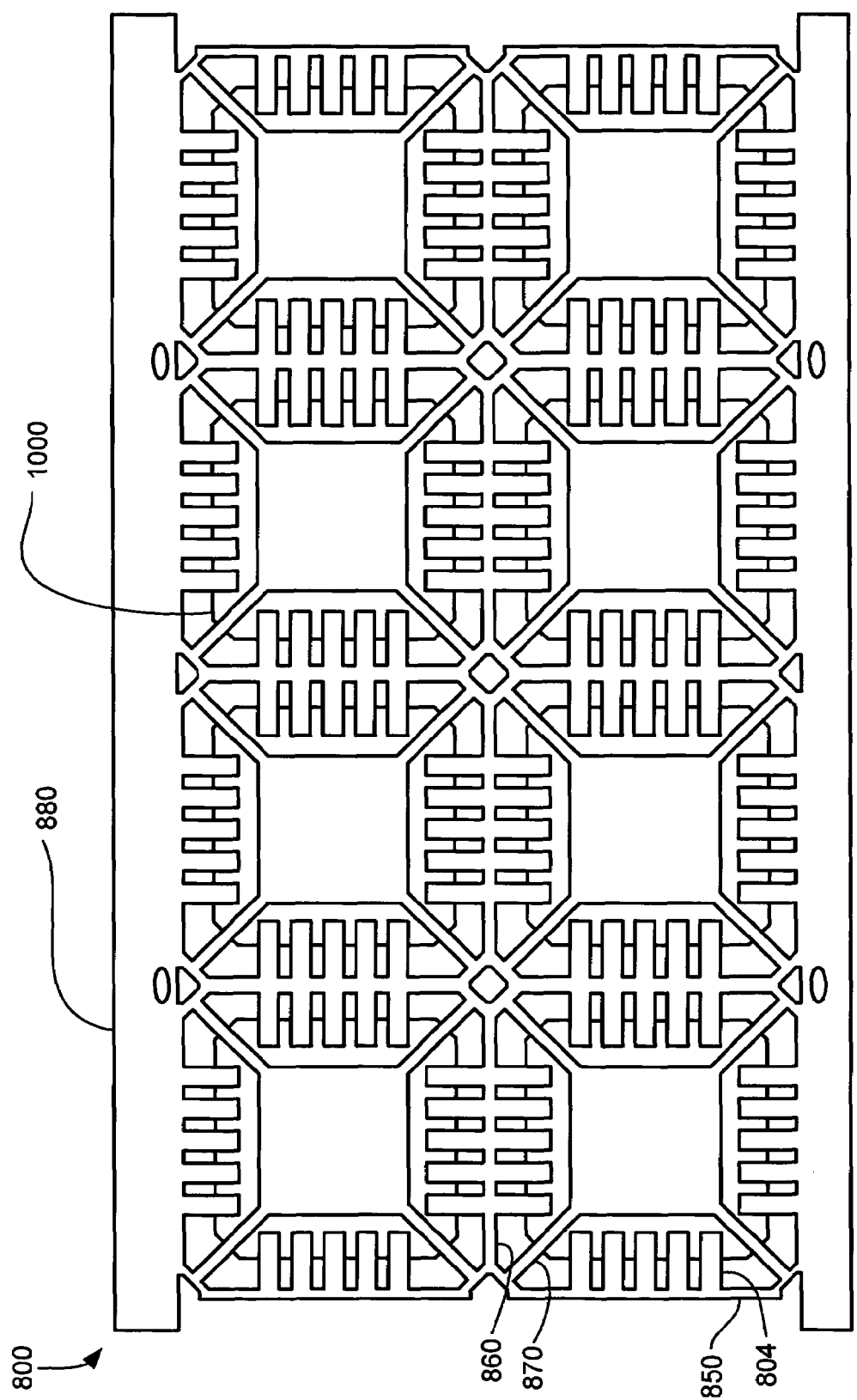
FIG. 11 is a bottom plan view of the structure of FIG. 8.

Referring now to FIG. 11, therein is shown a bottom plan view of the structure of FIG. 8. Each of the QFN semiconductor packages 1000 is positioned over the heat spreader 802 and the terminal pads 804.

Figure 12:
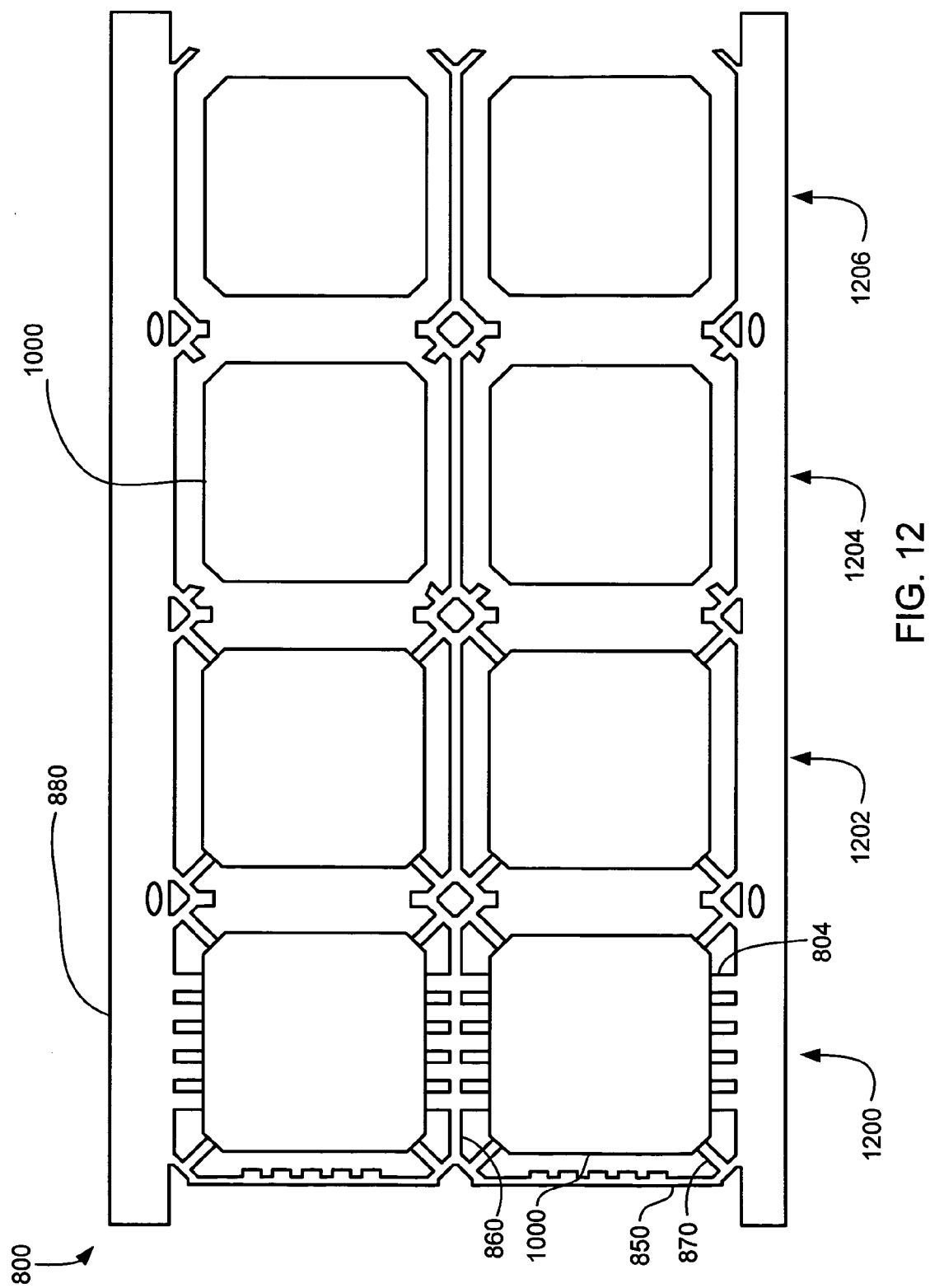
FIG. 12 is the structure of FIG. 10 showing the results of several intermediate steps in a singulation process.

Referring now to FIG. 12, therein is shown the structure of FIG. 10 showing the results of several intermediate steps in a singulation process. The QFN semiconductor packages 1000 in a column 1200 have been subjected to a y-axis cut to trim the QFN semiconductor packages 1000 from the vertical tie-bar 850. The terminal pads 804 connecting the QFN semiconductor packages 1000 to the vertical tie-bars 850 have been trimmed close to the vertical edges of the QFN semiconductor package 1000.

The QFN semiconductor packages 1000 in column 1202 have been subjected to an x-axis cut to trim the QFN semiconductor packages 1000 from the horizontal tie-bars 860. The terminal pads 804 connecting the QFN semiconductor packages 1000 to the horizontal tie-bars 850 have been trimmed close to the horizontal edges of the QFN semiconductor package 1000.

The QFN semiconductor packages 1000 in column 1204 have been subjected to a cut of the corner tie-bars 870. The cut of the corner tie-bars 870 frees the QFN semiconductor packages from the matrix of the heat spreader leadframe 800.

The QFN semiconductor packages 1000 in column 1206 are shown ready to undergo a pick-and-place step in which the completed multi-leadframe semiconductor packages are removed from the strip of heat spreader leadframes 800.

It will be apparent to those skilled in the art upon a reading of this description that, although the present invention has been shown and described in connection with saw singulation processes a punch singulation process in which more than one tie-bar is cut in a single step also could be used. Accordingly, the method and apparatus of the present invention does not preclude the use of either saw or punch singulation.

It has been discovered that a power semiconductor package can be manufactured using multiple leadframes of similar thickness resulting in reduced cost while maintaining manufacturing flexibility.

Figure 13:
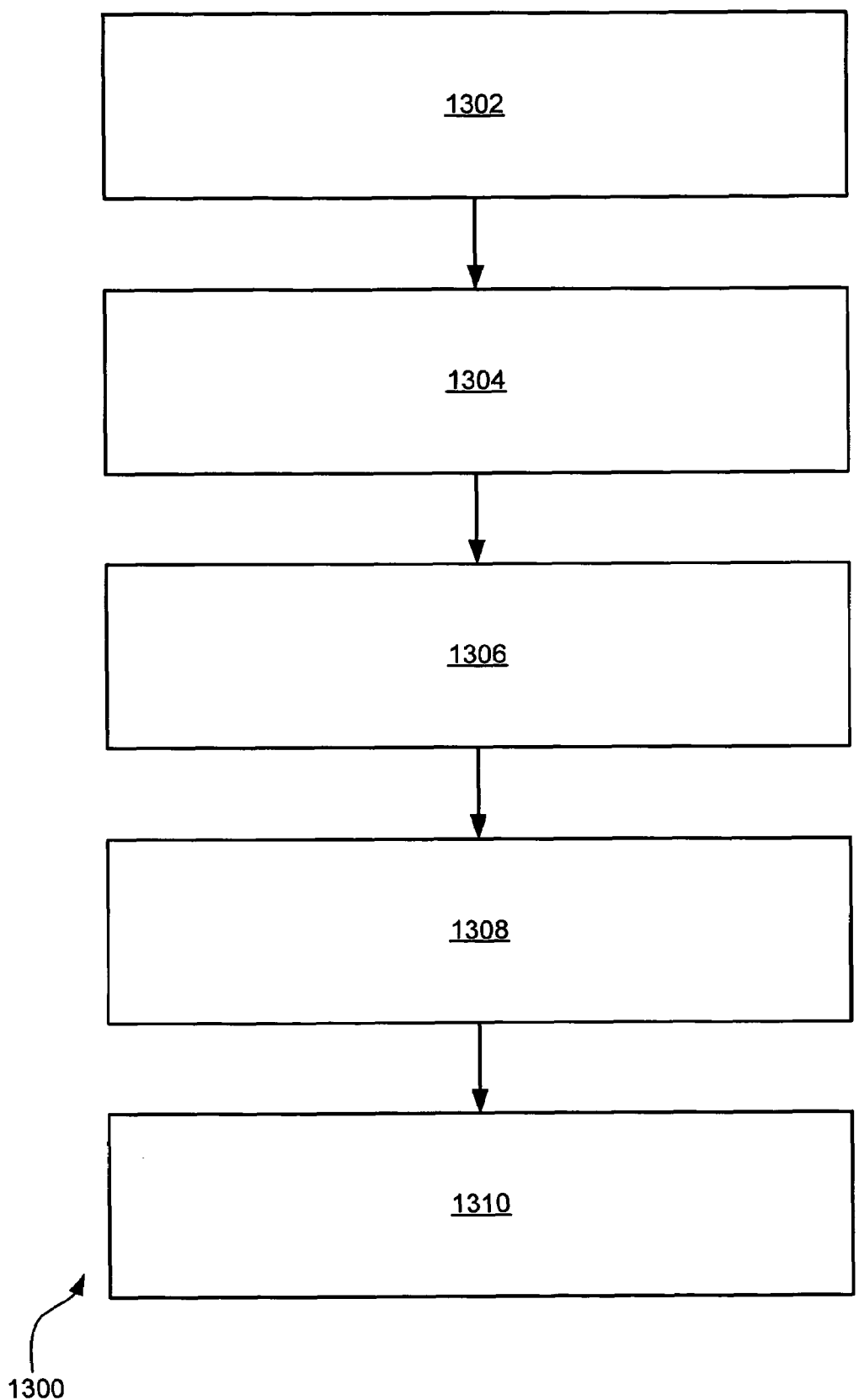
FIG. 13 is a flow chart of a method of manufacturing a multi-leadframe semiconductor package in accordance with an embodiment of the present invention.

Referring now to FIG. 13, therein is shown a flow chart of a method 1300 of manufacturing a multi-leadframe semiconductor package in accordance with an embodiment of the present invention. The method 1300 includes providing a first leadframe having a die pad and a plurality of contact leads around the periphery of the die pad in a block 1302; providing a die attached to the die pad and electrically connected to the plurality of contact leads in a block 1304; providing a heat spreader leadframe having a heat spreader and a plurality of terminal leads around the periphery of the heat spreader in a block 1306; attaching the die pad to the heat spreader in a block 1308; and attaching the plurality of contact leads to the plurality of terminal leads in a block 1310.

Thus, it has been discovered that the method and apparatus of the present invention furnish important and heretofore unavailable solutions, capabilities, and functional advantages for semiconductor packages. The resulting process and configurations are straightforward, economical, uncomplicated, highly versatile, and effective, use conventional technologies, and are thus readily suited for manufacturing semiconductor packages for power applications that are fully compatible with conventional manufacturing processes and technologies.

While the invention has been described in conjunction with a specific best mode, it is to be understood that many alternatives, modifications, and variations will be apparent to those skilled in the art in light of the foregoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

The invention claimed is:

1. A method of manufacturing a multi-leadframe semiconductor package comprising:
   providing a first leadframe having a die pad and a plurality of contact leads around the periphery of the die pad;
   providing a die attached to the die pad and electrically connected to the plurality of contact leads;
   providing a heat spreader leadframe having a heat spreader and a plurality of terminal leads around the periphery of the heat spreader;
   attaching the die pad to the heat spreader; and
   attaching the plurality of contact leads to the plurality of terminal leads.

2. The method of manufacturing a multi-leadframe semiconductor package as claimed in claim 1, wherein:
   providing the first leadframe provides a packaged integrated circuit comprising at least one of a packaged leaded integrated circuit, a packaged non-leaded integrated circuit, or a combination thereof.

3. The method of manufacturing a multi-leadframe semiconductor package as claimed in claim 1, wherein:
   attaching the die pad to the heat spreader and attaching the plurality of contact leads to the plurality of terminal leads use at least one of a eutectic solder, a high lead solder, a lead-free solder, a pre-form solder, an electrically and thermally conductive paste adhesive, an electrically and thermally conductive film adhesive, or a combination thereof.

4. The method of manufacturing a multi-leadframe semiconductor package as claimed in claim 1, wherein:
   providing the first leadframe provides a first leadframe having a finish of at least one of tin-lead solder, lead-free solder, nickel-palladium-gold alloy, and a combination thereof.

5. The method of manufacturing a multi-leadframe semiconductor package as claimed in claim 1, wherein:
   providing the first leadframe having a die pad provides a die pad having a first horizontal dimension and a first thickness; and
   providing the heat spreader leadframe provides a heat spreader having a second horizontal dimension and a second thickness;
   wherein the second horizontal dimension is at least equal to the first horizontal dimension and the second thickness is at least equal to the first thickness.

6. A method of manufacturing a multi-leadframe semiconductor package comprising:
   providing a first leadframe having a die pad and a plurality of contact leads around the periphery of the die pad;
   attaching a die to the die pad;
   wire bonding the die to the plurality of contact leads;
   forming an encapsulant to expose the lower surfaces of the die pad and the plurality of contact pads;
   providing a heat spreader leadframe having a heat spreader and a plurality of terminal leads around the periphery of the heat spreader; and
   attaching the die pad to the heat spreader.

7. The method of manufacturing a multi-leadframe semiconductor package as claimed in claim 6, wherein:

attaching the first leadframe to the heat spreader leadframe further comprises:
attaching the die pad to the heat spreader; and
attaching the plurality of contact pads to the plurality of terminal pads.

8. The method of manufacturing a multi-leadframe semiconductor package as claimed in claim 6, wherein:
attaching the first leadframe to the heat spreader leadframe uses at least one of a eutectic solder, a high lead solder, a lead-free solder, a pre-form solder, an electrically and thermally conductive paste adhesive, an electrically and thermally conductive film adhesive, or a combination thereof.

9. The method of manufacturing a multi-leadframe semiconductor package as claimed in claim 6, wherein:
providing the first leadframe provides a first leadframe having a finish of at least one of tin-lead solder, lead-free solder, nickel-palladium-gold alloy, and a combination thereof.

10. The method of manufacturing a multi-leadframe semiconductor package as claimed in claim 6, wherein:
providing the first leadframe having a die pad provides a die pad having a first horizontal dimension and a first thickness; and
attaching the first leadframe to the heat spreader leadframe attaches the die pad to a heat spreader having a second horizontal dimension and a second thickness;
wherein the second horizontal dimension is at least equal to the first horizontal dimension and the second thickness is at least equal to the first thickness.

11. A multi-leadframe semiconductor package comprising:
a first leadframe having a die pad and a plurality of contact leads around the periphery of the die pad;
a die attached to the die pad;
a heat spreader leadframe having a heat spreader and a plurality of terminal leads around the periphery of the heat spreader; and
means for attaching the die pad to the heat spreader.

12. The multi-leadframe semiconductor package as claimed in claim 11, wherein:
the first leadframe further comprises a packaged integrated circuit of at least one of a packaged leaded integrated circuit, a packaged non-leaded integrated circuit, or a combination thereof.

13. The multi-leadframe semiconductor package as claimed in claim 11, wherein:
the means for attaching the first leadframe to the heat spreader leadframe comprises at least one of a eutectic solder, a high lead solder, a lead-free solder, a pre-form solder, an electrically and thermally conductive paste adhesive, an electrically and thermally conductive film adhesive, or a combination thereof.

14. The multi-leadframe semiconductor package as claimed in claim 11, wherein:
the first leadframe has a finish of at least one of tin-lead solder, lead-free solder, nickel-palladium-gold alloy, and a combination thereof.

15. The multi-leadframe semiconductor package as claimed in claim 11, wherein:
the first leadframe comprises a die pad having a first horizontal dimension and a first thickness; and
the heat spreader leadframe comprises a heat spreader having a second horizontal dimension and a second thickness;
wherein the second horizontal dimension is at least equal to the first horizontal dimension and the second thickness is at least equal to the first thickness.

16. A multi-leadframe semiconductor package comprising:
a first leadframe having a die pad and a plurality of contact leads around the periphery of the die pad;
a die attached to the die pad;
bond wires electrically connecting the die to the plurality of contact leads;
an encapsulant to expose the lower surfaces of the die pad and the plurality of contact pads;
a heat spreader leadframe having a heat spreader and a plurality of terminal leads around the periphery of the heat spreader; and
means for attaching the die pad to the heat spreader.

17. The multi-leadframe semiconductor package as claimed in claim 16, wherein:
the die pad is attached to the heat spreader; and
the plurality of contact pads is attached to the plurality of terminal pads.

18. The multi-leadframe semiconductor package as claimed in claim 16, wherein:
the means for attaching the first leadframe to the heat spreader leadframe comprises at least one of a eutectic solder, a high lead solder, a lead-free solder, a pre-form solder, an electrically and thermally conductive paste adhesive, an electrically and thermally conductive film adhesive, or a combination thereof.

19. The multi-leadframe semiconductor package as claimed in claim 16, wherein:
the first leadframe has a finish of at least one of tin-lead solder, lead-free solder, nickel-palladium-gold alloy, and a combination thereof.

20. The multi-leadframe semiconductor package as claimed in claim 16, wherein:
the die pad has a first horizontal dimension and a first thickness; and
the heat spreader has a second horizontal dimension and a second thickness;
wherein the second horizontal dimension is at least equal to the first horizontal dimension and the second thickness is at least equal to the first thickness.

* * * * *